(12) United States Patent
Naval et al.

(10) Patent No.: US 8,012,868 B1
(45) Date of Patent: Sep. 6, 2011

(54) SEMICONDUCTOR DEVICE HAVING EMI SHIELDING AND METHOD THEREFOR

(76) Inventors: Herbert delos Santos Naval, Navotas City (PH); Noel A. Sur, San Pedro Laguna (PH); John A. Soriano, San Pedro Laguna (PH)

( * ) Notice: Subject to any disclaimer, the term of this patent is extended or adjusted under 35 U.S.C. 154(b) by 228 days.

(21) Appl. No.: 12/335,365

(22) Filed: Dec. 15, 2008

(51) Int. Cl.
  H01L 21/44 (2006.01)
  H01L 29/40 (2006.01)
(52) U.S. Cl. .................................. 438/617; 257/784
(58) Field of Classification Search .......... 257/659–660, 257/779–784; 438/617
See application file for complete search history.

(56) References Cited

U.S. PATENT DOCUMENTS

| | | | |
|---|---|---|---|
| 4,925,024 A | 5/1990 | Ellenberger et al. | |
| 5,166,772 A | 11/1992 | Soldner et al. | |
| 5,416,358 A | 5/1995 | Ochi et al. | |
| 5,468,999 A | 11/1995 | Lin et al. | |
| 5,473,191 A | 12/1995 | Tanaka | |
| 5,557,142 A | 9/1996 | Gilmore et al. | |
| 5,614,694 A | 3/1997 | Gorenz, Jr. et al. | |
| 5,639,989 A | 6/1997 | Higgins, III | |
| 5,656,864 A | 8/1997 | Mitsue et al. | |
| 5,694,300 A | 12/1997 | Mattei et al. | |
| 5,907,477 A | 5/1999 | Tuttle et al. | |
| 5,940,271 A | 8/1999 | Mertol | |
| 6,136,131 A | 10/2000 | Sosnowski | |
| 6,194,655 B1 | 2/2001 | Lange, Sr. et al. | |
| 6,246,115 B1 | 6/2001 | Tang et al. | |
| 6,423,570 B1 | 7/2002 | Ma et al. | |
| 6,433,420 B1 | 8/2002 | Yang et al. | |
| 6,465,280 B1 | 10/2002 | Martin et al. | |
| 6,602,737 B2 | 8/2003 | Wu | |
| 6,686,649 B1 | 2/2004 | Mathews et al. | |
| 7,030,469 B2 | 4/2006 | Mahadevan et al. | |
| 2002/0089832 A1 | 7/2002 | Huang | |
| 2003/0067757 A1 | 4/2003 | Richardson et al. | |
| 2005/0280139 A1 | 12/2005 | Zhao et al. | |
| 2007/0030661 A1 | 2/2007 | Morris et al. | |
| 2007/0241440 A1 * | 10/2007 | Hoang et al. .................. 257/685 |
| 2008/0000988 A1 * | 1/2008 | Farooq et al. ................. 235/492 |
| 2008/0014678 A1 * | 1/2008 | Howard et al. ............... 438/106 |

* cited by examiner

*Primary Examiner* — Calvin Lee
(74) *Attorney, Agent, or Firm* — Weiss & Moy, P.C.; Jeffrey D. Moy

(57) ABSTRACT

A semiconductor device has a substrate having a plurality of metal layers. A die coupled to the substrate. A first wire fence structure is formed on the substrate. A second wire fence structure is formed on the substrate. A mold compound is used for encapsulating the die, a first surface of the substrate, the first wire fence structure, and the second wire fence structure, wherein a top portion of at least one of the first wire fence structure or the second wire fence structure is exposed. A conductive coating is applied to the mold compound and to the portion of the at least one of the first wire fence structure or the second wire fence structure is exposed.

17 Claims, 3 Drawing Sheets

SEMICONDUCTOR DEVICE HAVING EMI SHIELDING AND METHOD THEREFOR

FIELD OF THE INVENTION

This invention relates to semiconductor devices and, more specifically, to a semiconductor device having an integrated Electro-Magnetic Interference (EMI) shielding which is connected to exposed wires coupled to grounding pads.

BACKGROUND OF THE INVENTION

Electro-Magnetic Interference (EMI) shielding is required on certain semiconductor devices in order to minimize EMI radiation from the semiconductor device. EMI shielding is further required to prevent EMI radiation from external sources from interfering with operation of the semiconductor device.

EMI shielding is generally accomplished in one of three ways. A first method is to attach a metal can over the component after the component is attached to the motherboard. However, shield attach on the mother board has several problems. First, shield attach can be costly and a low yielding process. External shields soldered to the motherboard further require additional board space.

An alternative to the shield attached method described above is an embedded EMI shield. In an embedded shield, the metal EMI shield is directly attached to the semiconductor package substrate by means of solder or a conductive adhesive. The shield may be fully embedded within the mold compound of the finished package or can be exposed after assembly. In either case, the addition of a metal shield as a component attached to the top surface of the substrate is problematic for several reasons. First, the addition of a metal shield as a component attached to the top surface of the substrate requires a significant amount of additional space on the package substrate. Second, it can be difficult to transfer mold in and around the metal shield to fully encapsulate the semiconductor package. Shield attach is also problematic due to flux creep after the shield is attached and delamination and extrusion issues if solder is used to attach the shield. Metal shields also increase the thickness of the component and may inhibit the ability to inspect components under the shield during the assembly process.

The third method is the conventional conformal shield. In this method, all of the components are placed on the substrate and the substrate, or strip, is over-molded using unit molding, or pin gate molding where individual mold caps are defined within the strip such that upward facing, exposed pads in the substrate remain exposed after the mold operation. A conductive coating is then applied to the strip such that it covers the units and also makes electrical contact to the upward facing pads. The strip is then singulated into individual units. While this technique eliminates the molding process concerns associated with the aforementioned embedded shield method, it does not eliminate the added substrate size required to form the so-called upward facing, exposed pads. Therefore, all of the existing solutions can be said to require these large contact pads on the top, or upward facing surface of the substrate.

Therefore, a need existed to provide a device and method to overcome the above problems.

SUMMARY OF THE INVENTION

A semiconductor device has a substrate having a plurality of metal layers. A die is coupled to the substrate. A first plurality of metal wires is provided, wherein both ends of each of the first plurality of metal wires are coupled to at least one metal layer to form a loop of a first height. A second plurality of metal wires are provided, wherein both ends of each of the second plurality of metal wires are coupled to at least one metal layer to form a loop of a second height. A mold compound is used to encapsulate the die, a first surface of the substrate, the first plurality of metal wires, and the second plurality of metal wires, wherein a portion of the loop of at least one metal wire of at least one of the first plurality of metal wires and second plurality of metal wires is exposed. A conductive coating is applied to the mold compound and to the portion of the loop of the at least one metal wire exposed.

A semiconductor device has a substrate having a plurality of metal layers. A die is coupled to the substrate. A first wire fence structure is formed on the substrate. A second wire fence structure is formed on the substrate. A mold compound is used for encapsulating the die, a first surface of the substrate, the first wire fence structure, and the second wire fence structure, wherein a top portion of at least one of the first wire fence structure and the second wire fence structure is exposed. A conductive coating is applied to the mold compound and to the portion of the at least one of the first wire fence structure and the second wire fence structure is exposed.

The present invention is best understood by reference to the following detailed description when read in conjunction with the accompanying drawings.

BRIEF DESCRIPTION OF THE DRAWINGS

Common reference numerals are used throughout the drawings and detailed description to indicate like elements.

DETAILED DESCRIPTION

Figure 1:
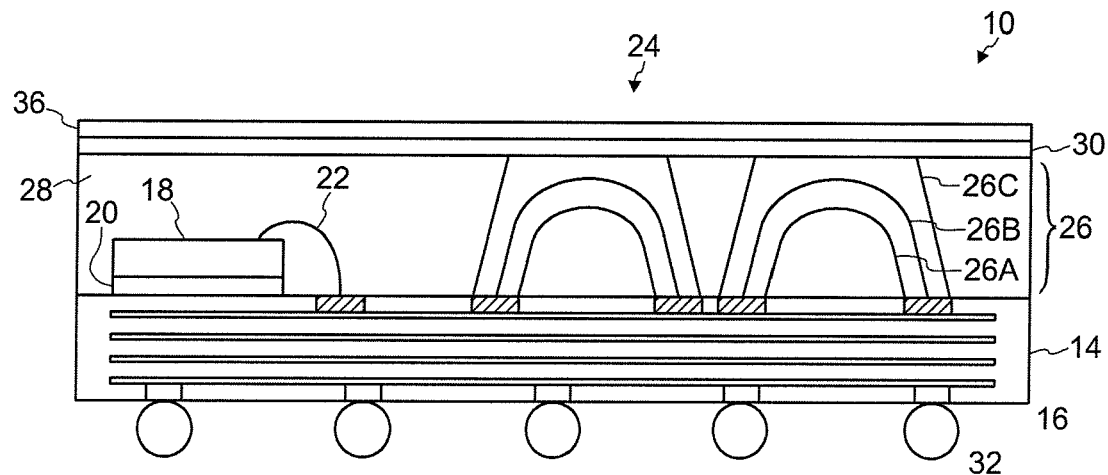
FIG. 1 is a cross-sectional view of one embodiment of the semiconductor device of the present invention.
Figure 2:
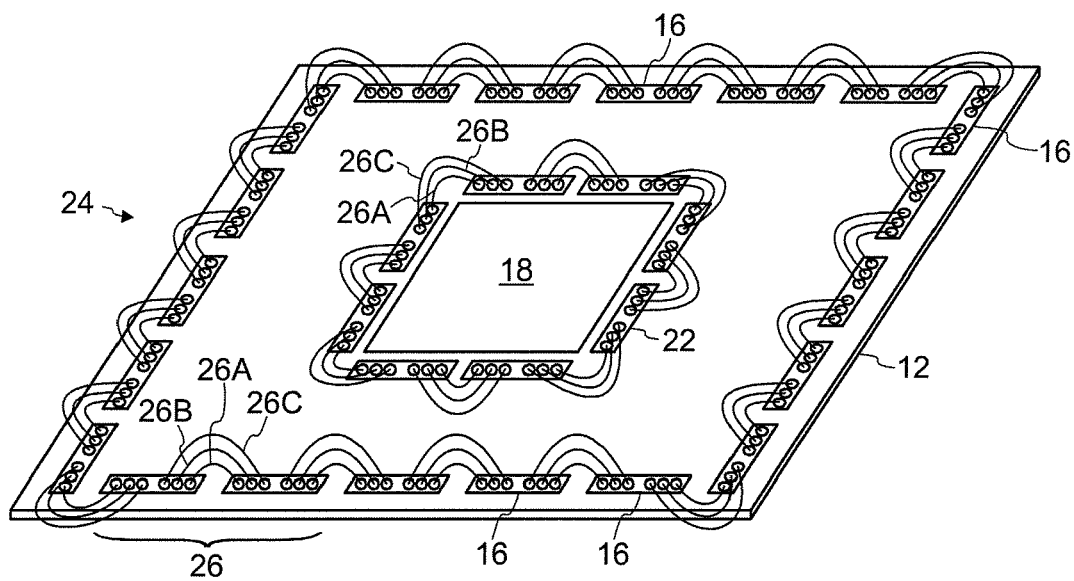
FIG. 2 is an elevated perspective view of the semiconductor device of FIG. 1 with the encapsulation material removed.
Figure 3:
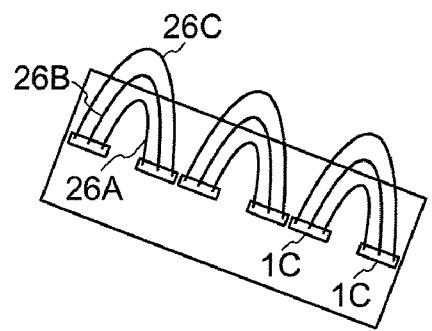
FIG. 3 is an elevated perspective view of one section of the wire fencing used in the semiconductor device of FIG. 1 with the encapsulation material removed.

Referring to FIGS. 1-3, a semiconductor device 10 is shown. The semiconductor device 10 may be a lead type of device, a BGA type of device, a Land Grid Array (LGA) type of device, or the like. The listing of the above should not be seen as to limit the scope of the present invention.

The device 10 has a substrate 12. The substrate 12 may be any one chosen from a conventional rigid PCB, a flexible PCB, and an equivalent thereof, but the kind of first substrate 12 is not limited herein. The substrate 12 includes an insulation layer 14 having predetermined area and thickness. The insulation layer 14 has an approximately planar first surface and an approximately planar second surface opposing the first surface. The insulation layer 14 will have one or more metal traces 16 formed thereon. In the embodiment shown in FIG. 1, the insulation layer 14 has metal traces 16 formed on the first and second surface of the insulation layer 14. The number of metal traces 16 is not limited to the number shown in the FIG. 1. In general, the insulation layer 14 will have multiple layers of metal traces 16 formed therein. If multiple layers of metal traces 16 are formed in the insulation layer 14, a dielectric layer is generally applied between the layers of metal traces 16. The dielectric layer is used as an insulating layer to separate the layers of metal traces 16.

A die 18 is attached to the substrate 12. The die 18 may be an RF die, a memory die, a logic die, an ASIC die, and other like elements. It should be noted that the listing of the above types of dies is given as an example and should not be seen as to limit the scope of the present invention. The die 18 will have an approximately planar first surface and an approximately planar second surface opposing the first surface. The die 18 may be coupled to the substrate 12 in a plurality of different manners. In the embodiment shown in FIG. 1, an adhesive 20 is used to couple the second surface of the die 18 to the first surface of the substrate 12. The adhesive 20 may be an adhesive film, an epoxy, or the like. The listing of the above adhesive types is given as examples and should not be seen as to limit the scope of the present invention. The die 18 is then electrically coupled to the substrate 12. In the present embodiment, wirebonds 22 are used to electrically couple the die 18 to the substrate 12. The wirebond 22 form an electrical connection between a bond pad formed as part of metal trace 16 on the first surface of the substrate 12 and a bond pad formed on the first surface of the die 18. Alternatively, the die 18 may be coupled to the substrate 12 through flip chip bonding, surface mount technology (SMT) or the like.

A wire shield 24 is positioned on the substrate 12. The wire shield 24 is used to provide an RF shield for the device 10. The wire shield 24 may be formed around a perimeter of the substrate 12 (See FIG. 9), around a perimeter of the die 18 (See FIG. 2), or both around a perimeter of the substrate 12 and around a perimeter of the die 18 (See FIG. 2). Alternatively, the wire shield 24 may be formed to section off certain areas of the substrate 12 to provide compartmental RF shielding (See FIG. 10). The above placement of the wire shield 24 is given as examples and should not be seen as to limit the scope of the present invention.

The wire shield 24 is formed of a plurality of metal wires 26. The metal wires 26 are electrically coupled to the metal traces 16 formed on the first surface of the insulation layer 20. In general, the metal wires 26 are wirebonded to the metal traces 16. In accordance with one embodiment, both ends of the metal wires 26 are electrically coupled to the metal traces 16 so that the metal wires 26 form a loop. The metal wires 26 may be gold, copper, aluminum, or the like. The listing of the above is given as examples and should not be seen as to limit the scope of the present invention. The metal traces 16 to which both ends of the metal wires 26 are attached are ground pads.

In the embodiment depicted in FIGS. 1-3, the wire shield 24 is formed of a plurality of metal wires 26 in a stacked pattern wherein the metal wires 26 are positioned over one another in a planer manner and form loops of varying height. A first set of metal wires 26A are positioned on the substrate 12 and form a loop having a first height. A second set of metal wires 26B will each form a loop of a second height. Each of the metal wires 26B will be positioned to form a loop over a corresponding metal wire 26A and in approximately the same vertical plane as the corresponding metal wire 26A. In the embodiment depicted in FIGS. 1-3, a third set of metal wires 26C will each form a loop of a third height. Each of the metal wires 26C will be positioned to form a loop over a corresponding metal wire 26B and in approximately the same vertical plane as the corresponding metal wire 26B and 26A. Thus, the loop height of each of each metal wires 26C will be higher than the loop height of the corresponding metal wires 26A and 26B.

While the embodiment depicted in FIGS. 1-3 shows three sets of metal wire loops, additional sets or fewer sets of metal wire loops may be placed on the substrate 12 without departing from the spirit and scope of the present invention. Each additional set of the metal wire loops would be positioned on the substrate 12 so that a metal wire 26 from the current set of metal wire loops would form a loop over a corresponding metal wire 26 of the preceding set of metal wires 26. The number, pitch and diameter of the metal wires 26 may be changed to alter the shielding effect. Thus, the number of wires, spacing between the wires and/or diameter of the wires may be increased to proved greater shielding coverage and may be lessened for devices that require less shielding.

A mold compound 28 is used to encapsulate the semiconductor device 10. The mold compound 28 is mainly made of non-conductive material, which is applied on the top surface of the die 12 and substrate 16. During the process of applying the mold compound 28, the tallest set of loops formed by the metal wires 26 are compressed by the mold tooling so that the top of the loop of the tallest set of metal wires 26 are exposed. Thus, in the present embodiment, the top of the loop of the third set of metal wires 26C will be compressed so that the top of each metal wire 26C will be exposed.

A cleaning process may be performed to remove any mold compound 28 that may have formed on the top of the loop of the metal wires 26C. The cleaning process will clean the contact area of the metal wire 26 resulting in increased contact area and reduced contact resistance between the metal wire 26 and a conductive coating 30 to be applied. The cleaning process may be done by chemical removal process, a grinding process or other physical abrasion techniques, laser ablation, and the like. The listing of the above is given as examples and should not be seen as to apply to a specific embodiment or to limit the scope of the present invention.

A conductive coating 30 is then applied to the semiconductor device 10. The conductive coating 30 is used to provide EMI shielding for the semiconductor device 10. The conductive coating 30 may be applied by plating, vacuum printing, vacuum deposition, insert molding, spray coating, and the like. The conductive coating 30 is applied to the top surface of the semiconductor device 10. The conductive coating 30 is applied so that the conductive coating 30 is in contact with the exposed portion of the top of the loop of the metal wires 26C. Thus, the semiconductor device 10 will have a conductive coating 30 that contacts grounded metal. In FIG. 1, the conductive coating 30 is a conformal coating. In a conformal coating, a thin layer of the conductive coating 30 is applied to the top surface of the semiconductor device 10.

A non-conductive coating 36 may be applied to the conductive coating 30. The non-conductive coating 36 is used as a protective layer to protect the conductive coating 30 and hence the device 10 from solvents, solders, fluxes, etc.

Electrical contacts 32 are coupled to a second surface of the substrate 16. The electrical contacts 32 may be a plurality of solder balls as shown in FIG. 1, a plurality of leads, or the like. If solder balls are used, the solder balls will be electrically coupled to the second surface of the substrate 12. In general, a reflow process may be used to couple the solder balls to the second surface of the substrate 12. Alternative methods may be used to couple the leads to the substrate 16 without departing from the spirit and scope of the present invention.

The wire shield 24 provides a more compressive RF shielding for the device 10. The top of the loop of the metal wires 26C coupled to the conductive coating 30 provides an RF shield over the top of the device 10. The metal wires 26A and 26B provide an RF shield around the sides/perimeter of the device 10. Thus, an RF shield is formed around the top and side surfaces of the device 10.

Figure 4:
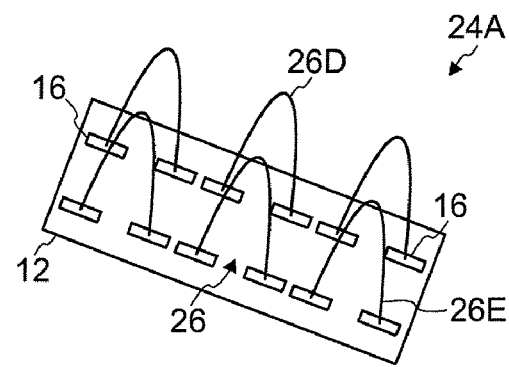
FIG. 4 is a an elevated perspective view of another embodiment of the wire fencing used in the semiconductor device of the present invention with the encapsulation material removed.

Referring now to FIG. 4, another embodiment of the wire shield 24A is shown. In this embodiment, the metal wires 26 are again positioned on the substrate 12 so that both ends of the metal wires 26 are electrically coupled to the metal traces 16 to form a loop. The loops formed by the metal wires 26 are positioned on the substrate 12 in a side by side configuration. In this embodiment, the wire shield 24A has a first set of metal wires 26D positioned on the substrate 12. Each of the first set of metal wires 26D will form a loop having a first height. A second set of metal wires 26E are positioned on the substrate 12 next to and approximately aligned with a corresponding metal wire from the first set of metal wires 26D. Each of the second set of metal wires 26E will form a loop having a second height. In the embodiment shown in FIG. 4, the height of the loops formed by the second set of metal wires 26E is approximately equal to the loop height of the first set of metal wires 26D. However, this is shown only as an example and should not be seen as to limit the scope of the present invention, as the height of the loops formed by the second set of metal wires 26E may be greater than or less than the loop height of the first set of metal wires 26D.

While the embodiment depicted in FIG. 4 shows two sets of metal wire loops, additional sets of metal wire loops may be placed on the substrate 12 without departing from the spirit and scope of the present invention. Each additional set of the metal wire loops would be positioned on the substrate 12 so that a metal wire 26 from the current set of metal wire loops would be positioned on the substrate 12 next to and approximately aligned with a corresponding metal wire 26 from a preceding set of metal wire loops. The number, pitch and diameter of the metal wires 26 may be changed to alter the shielding effect. Thus, the number of wires, spacing between the wires and/or diameter of the wires may be increased to proved greater shielding coverage and may be lessened for devices that require less shielding.

The mold compound 28 is then used to encapsulate the semiconductor device 10. In the present embodiment, the height of the loops formed by the second set of metal wires 26E is approximately equal to the loop height of the first set of metal wires 26D. Thus the top of the loop of the first and second set of metal wires 26D and 26E will be compressed so that the top of each metal wire 26D and 26E will be exposed. However, this is shown only as an example and should not be seen as to limit the scope of the present invention, as the height of the loops formed by the second set of metal wires 26E may be greater than or less than the loop height of the first set of metal wires 26D.

A conductive coating 30 is then applied to the semiconductor device 10. The conductive coating 30 is applied to the top surface of the semiconductor device 10. The conductive coating 30 is applied so that the conductive coating 30 is in contact with the exposed portion of the top of the loop of the metal wires 26D and 26E. Thus, the semiconductor device 10 will have a conductive coating 30 that contacts grounded metal. The non-conductive coating 36 may then be applied to the conductive coating 30. The non-conductive coating 36 is used as a protective layer to protect the conductive coating 30 and hence the device 10 from solvents, solders, fluxes, etc.

Figure 5:
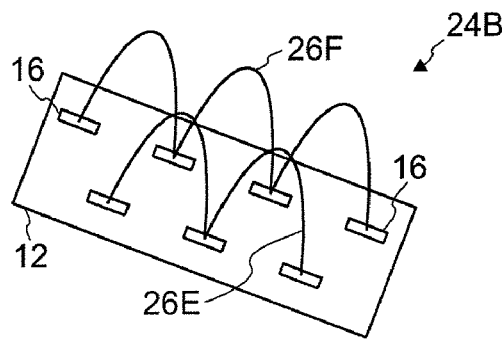
FIG. 5 is an elevated perspective view of another embodiment of the wire fencing used in the semiconductor device of the present invention with the encapsulation material removed.

Referring now to FIG. 5, another embodiment of the wire shield 24B is shown. The wire shield 24B is similar to the wire shield 24A shown in FIG. 4. In this embodiment, the metal wires 26 are again positioned on the substrate 12 so that both ends of the metal wires 26 are electrically coupled to the metal traces 16 to form a loop. The loops formed by the metal wires 26 are positioned on the substrate 12 in an alternating side by side configuration. In this embodiment, the wire shield 24B has a first set of metal wires 26F positioned on the substrate 12. Each of the first set of metal wires 26F will form a loop having a first height. A second set of metal wires 26G are positioned on the substrate 12 next to a corresponding metal wire 26 from the first set of metal wires 26F and forms a loop having a second height. The second set of metal wires 26G are positioned so that the top of the loops formed by the second set of metal wires 26G is in between the top of the loops formed by consecutive metal wires of the first set of metal wires 26F. In the embodiment shown in FIG. 5, the height of the loops formed by the second set of metal wires 26G is approximately equal to the loop height of the first set of metal wires 26F. However, this is shown only as an example and should not be seen as to limit the scope of the present invention, as the height of the loops formed by the second set of metal wires 26D may be greater than or less than the loop height of the first set of metal wires 26D.

While the embodiment depicted in FIG. 5 shows two sets of metal wire loops, additional sets of metal wire loops may be placed on the substrate 12 without departing from the spirit and scope of the present invention. Each additional set of the metal wire loops would be positioned on the substrate 12 and positioned so that a top of the loop formed by a current set of metal wires 26 is in between the top of the loops formed by consecutive metal wires 26 of a preceding set. The number, pitch and diameter of the metal wires 26 may be changed to alter the shielding effect. Thus, the number of wires, spacing between the wires and/or diameter of the wires may be increased to proved greater shielding coverage and may be lessened for devices that require less shielding.

The mold compound 28 is then used to encapsulate the semiconductor device 10. In the present embodiment, the height of the loops formed by the second set of metal wires 26G is approximately equal to the loop height of the first set of metal wires 26F, thus the top of the loop of the first and second set of metal wires 26F and 26G will be compressed so that the top of each metal wire 26F and 26G will be exposed. However, this is shown only as an example and should not be seen as to limit the scope of the present invention, as the height of the loops formed by the second set of metal wires 26G may be greater than or less than the loop height of the first set of metal wires 26F as well.

A conductive coating 30 is then applied to the semiconductor device 10. The conductive coating 30 is applied to the top surface of the semiconductor device 10. The conductive coating 30 is applied so that the conductive coating 30 is in contact with the exposed portion of the top of the loop of the first and second sets of metal wires 26F and 26G. Thus, the semiconductor device 10 will have a conductive coating 30 that contacts grounded metal. The non-conductive coating 36 may then be applied to the conductive coating 30. The non-conductive coating 36 is used as a protective layer to protect the conductive coating 30 and hence the device 10 from solvents, solders, fluxes, etc.

Figure 6:
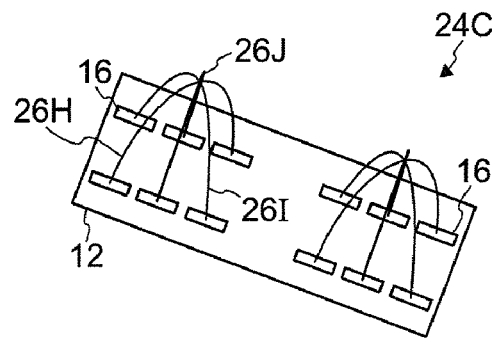
FIG. 6 is a an elevated perspective view of another embodiment of the wire fencing used in the semiconductor device of the present invention with the encapsulation material removed.

Referring now to FIG. 6, another embodiment of the wire shield 24C is shown. In this embodiment, the metal wires 26 are again positioned on the substrate 12 so that both ends of the metal wires 26 are electrically coupled to the metal traces 16 to form a loop. The loops formed by the metal wires 26 are positioned on the substrate 12 in an intersecting layout. In this embodiment, the wire shield 24C has a first set of metal wires 26H. Each of the first set of metal wires 26H will form a loop having a first height. A second set of metal wires 26I will are positioned on the substrate 12 and form a loop of a second height which cross-over a corresponding metal wire from the first set of metal wires 26H. In the embodiment shown in FIG. 6, the height of the loops formed by the second set of metal wires 26I is slightly higher than the loop height of the first set of metal wires 26H to allow the second set of metal wires 26I to cross-over a corresponding metal wire 26 from the first set of metal wires 26H. However, this is shown only as an example and should not be seen as to limit the scope of the present invention. A third set of metal wires 26J are positioned on the substrate 12 and form a loop of a third height which cross-over corresponding metal wires from the first set of metal wires 26H and the second set of metal wires 26I. In the embodiment shown in FIG. 5, the height of the loops formed by the third set of metal wires 26J is slightly higher than the loop height of the first set of metal wires 26H and the second of metal wires 26I to allow the third set of metal wires 26J to cross-over corresponding metal wires 26 from the first set of metal wires 26H and the second set of metal wires 26I. However, this is shown only as an example and should not be seen as to limit the scope of the present invention.

While the embodiment depicted in FIG. 6 shows three sets of metal wire loops, additional sets of metal wire loops may be placed on the substrate 12 without departing from the spirit and scope of the present invention. Each additional set of the metal wire loops would be positioned on the substrate 12 to cross-over corresponding metal wires 26 from the previous sets of metal wire loops. The number, pitch and diameter of the metal wires 26 may be changed to alter the shielding effect. Thus, the number of wires, spacing between the wires and/or diameter of the wires may be increased to proved greater shielding coverage and may be lessened for devices that require less shielding.

The mold compound 28 is then used to encapsulate the semiconductor device 10. In the present embodiment, the height of the loops formed by the third set of metal wires 26J is the highest, thus the top of the loop of the third set of metal wires 26J will be compressed so that the top of each metal wire 26J will be exposed. However, this is shown only as an example and should not be seen as to limit the scope of the present invention.

A conductive coating 30 is then applied to the semiconductor device 10. The conductive coating 30 is applied to the top surface of the semiconductor device 10. The conductive coating 30 is applied so that the conductive coating 30 is in contact with the exposed portion of the top of the loop of the metal wires 26J. Thus, the semiconductor device 10 will have a conductive coating 30 that contacts grounded metal. The non-conductive coating 36 may then be applied to the conductive coating 30. The non-conductive coating 36 is used as a protective layer to protect the conductive coating 30 and hence the device 10 from solvents, solders, fluxes, etc.

Figure 7:
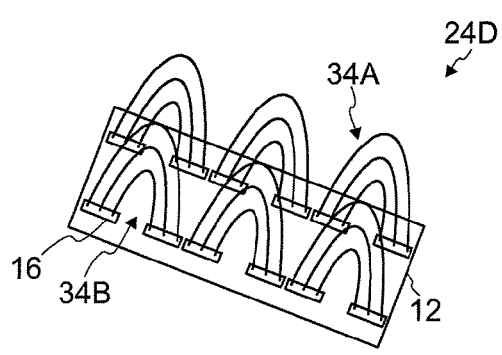
FIG. 7 is an elevated perspective view of another embodiment of the wire fencing used in the semiconductor device of FIG. 1 with the encapsulation material removed.

Referring now to FIG. 7, another embodiment of the wire shield 24D is shown. In the embodiment shown in FIG. 7, the wire shield 24D is a combination of the wire shields shown in FIGS. 2-3 and 4. Thus, the wire shield 24D will have a first wire fence 34A formed as a stacked pattern wherein the metal wires 26 are positioned over one another and form loops of varying height. A second wire fence 34B also formed as a stacked pattern wherein the metal wires 26 are positioned over one another and form loops of varying height is positioned next to and approximately aligned with the first wire fence 34A.

While the embodiment depicted in FIG. 7 shows two sets of wire fences 34A and 34B, additional sets of wire fences may be placed on the substrate 12 without departing from the spirit and scope of the present invention. Each additional wire fence would be formed as a stacked pattern wherein the metal wires 26 are positioned over one another and form loops of varying height and positioned next to and approximately aligned with the first wire fence 34A and the second wire fence 34B.

The mold compound 28 is then used to encapsulate the semiconductor device 10. In the present embodiment, the height of the first wire fence 34A is approximately equal to the height of the second wire fence 34B, thus the top surfaces of both the first and second wire fences 34A and 34B will be compressed and exposed. However, this is shown only as an example and should not be seen as to limit the scope of the present invention, as the height of the first wire fence 34A may be greater than or less than the height of the second wire fence 34B.

A conductive coating 30 is then applied to the semiconductor device 10. The conductive coating 30 is applied to the top surface of the semiconductor device 10. The conductive coating 30 is applied so that the conductive coating 30 is in contact with the exposed top surfaces of the first and second wire fences 34A and 34B. Thus, the semiconductor device 10 will have a conductive coating 30 that contacts grounded metal. The non-conductive coating 36 may then be applied to the conductive coating 30. The non-conductive coating 36 is used as a protective layer to protect the conductive coating 30 and hence the device 10 from solvents, solders, fluxes, etc.

Figure 8:
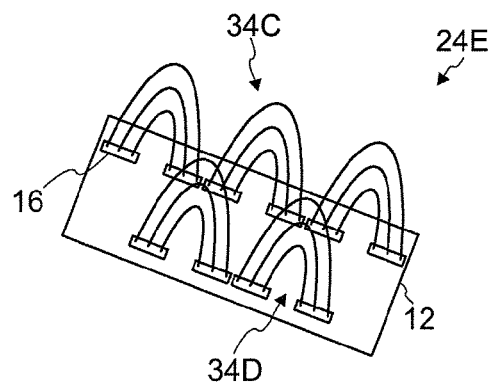
FIG. 8 is an elevated perspective view of another embodiment of the wire fencing used in the semiconductor device of FIG. 1 with the encapsulation material removed.

Referring now to FIG. 8, another embodiment of the wire shield 24E is shown. In the embodiment shown in FIG. 8, the wire shield 24E is a combination of the wire shields shown in FIGS. 2 and 4. Thus, the wire shield 24E will have a first wire fence 34C formed as a stacked pattern wherein the metal wires 26 are positioned over one another and form loops of varying height. A second wire fence 34D also formed as a stacked pattern wherein the metal wires 26 are positioned over one another and form loops of varying height is positioned next to and in an alternating pattern with the first wire fence 34C. The second wire fence 34D is positioned next to the first wire fence 34C where gaps are formed in the first wire fence 34C.

While the embodiment depicted in FIG. 8 shows two sets of wire fences 34C and 34D, additional sets of wire fences may be placed on the substrate 12 without departing from the spirit and scope of the present invention. The number, pitch and diameter of the metal wires 26 of the wire fences may be changed to alter the shielding effect. Thus, the number of wires, spacing between the wires and/or diameter of the wires may be increased to proved greater shielding coverage and may be lessened for devices that require less shielding.

The mold compound 28 is then used to encapsulate the semiconductor device 10. In the present embodiment, the height of the first wire fence 34C is approximately equal to the height of the second wire fence 34D, thus the top surfaces of both the first and second wire fences 34C and 34D will be compressed and exposed. However, this is shown only as an example and should not be seen as to limit the scope of the present invention, as the height of the first wire fence 34C may be greater than or less than the height of the second wire fence 34D.

Figure 9:
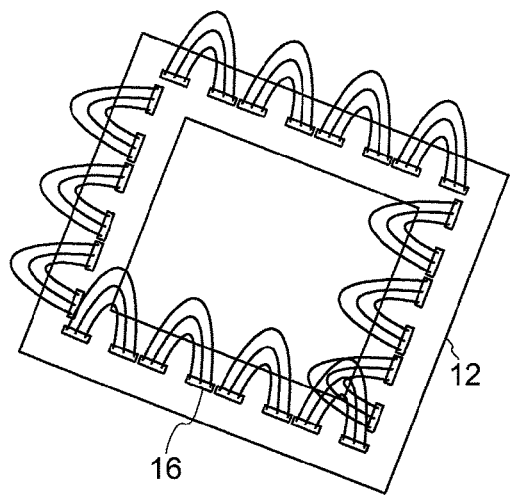
FIG. 9 is an elevated perspective view of another embodiment of where the wire fencing is placed on the semiconductor device of FIG. 1 with the encapsulation material removed.

A conductive coating 30 is then applied to the semiconductor device 10. The conductive coating 30 is applied to the top surface of the semiconductor device 10. The conductive coating 30 is applied so that the conductive coating 30 is in contact with the exposed top surfaces of the first and second wire fences 34C and 34D. Thus, the semiconductor device 10 will have a conductive coating 30 that contacts grounded metal. A non-conductive coating 36 may be applied to the conductive coating 30. The non-conductive coating 36 is used as a protective layer to protect the conductive coating 30 and hence the device 10 from solvents, solders, fluxes, etc. Referring now to FIG. 9, one embodiment is shown depicting the position of the wire shield 24 on the substrate 12. In this embodiment, the wire shield 24 is formed around a perimeter of the substrate 12. By forming the wire shield 24 around the perimeter of the substrate 12, the wire shield 24 provides peripheral RF shielding for the device 10. While the structure of the wire shield 24 shown in FIG. 9 takes the form of that shown in FIGS. 1-3, the wire shield 24 may take on any of the forms described above. Thus, the wire shield 24 may take the form of that shown in FIGS. 4-8 as well without departing from the spirit and scope of the present invention.

Figure 10:
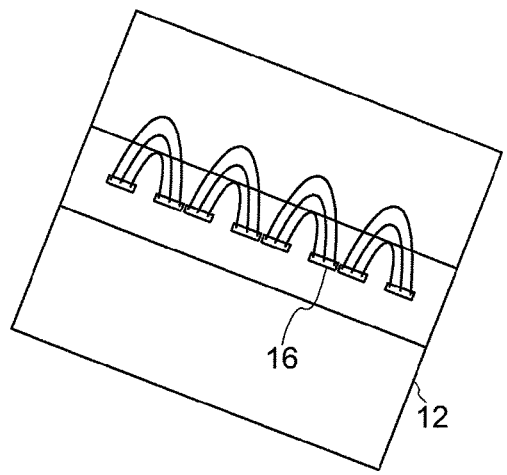
FIG. 10 is an elevated perspective view of another embodiment of where the wire fencing is placed on the semiconductor device of FIG. 1 with the encapsulation material removed.

Referring now to FIG. 10, another embodiment is shown depicting the position of the wire shield 24 on the substrate 12. In this embodiment, the wire shield 24 is formed to section off certain areas of the substrate 12. In this embodiment, the wire shield 24 is formed down a central area of the substrate 14 to provide compartmental RF shielding. The above placement of the wire shield 24 in FIG. 10 is given as examples and should not be seen as to limit the scope of the present invention. The wire shield 24 may be formed around other areas of the substrate 14. For example, the wire shield 24 may be formed around the die 18 as shown in FIG. 2. While the structure of the wire shield 24 shown in FIG. 10 takes the form of that shown in FIGS. 1-3, the wire shield 24 may take on any of the forms described above. Thus, the wire shield 24 may take the form of that shown in FIGS. 4-8 as well without departing from the spirit and scope of the present invention.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A method of manufacturing a semiconductor device comprising:
providing a substrate having a plurality of metal layers;
coupling a die to a first surface of the substrate;
attaching a first wire fence structure and a second wire fence structure to the metal layers on the substrate, wherein the second wire fence structure forms a loop over the first wire fence structure and is in the same vertical plane as the first wire fence structure;
applying a mold compound to encapsulate the die, a first surface of the substrate, the first wire fence structure, and the second wire fence structure, wherein a top portion of at least one of the first wire fence structure or the second wire fence structure is exposed; and
applying a conductive coating to the mold compound and to the portion of the at least one of the first wire fence structure or the second wire fence structure exposed.

2. A semiconductor device in accordance with claim 1, wherein attaching a first wire fence structure and a second wire fence structure to the metal layers on the substrate comprises:
attaching a first plurality of metal wires to the metal layers on the substrate to form the first wire fence structure, wherein both ends of each metal wire of the first plurality of metal wires are coupled to at least one metal layer to form a loop of a first height;
attaching a second plurality of metal wires to the metal layers on the substrate to form the second wire fence structure, wherein both ends of each metal wire of the second plurality of metal wires are coupled to at least one metal layer to form a loop of a second height.

3. A semiconductor device in accordance with claim 1, further comprising applying a nonconductive coating applied to the mold compound.

4. A semiconductor device comprising:
a substrate having a plurality of metal layers;
a die coupled to the substrate;
a first wire fence structure formed on the substrate;
a second wire fence structure formed on the substrate, wherein the second wire fence structure forms a loop over the first wire fence structure and is in the same vertical plane as the first wire fence structure;
a mold compound encapsulating the die, a first surface of the substrate, the first wire fence structure, and the second wire fence structure, wherein a top portion of at least one of the first wire fence structure or the second wire fence structure is exposed; and
a conductive coating applied to the mold compound and to the portion of the at least one of the first wire fence structure or the second wire fence structure is exposed.

5. A semiconductor device in accordance with claim 4, wherein the first wire fence structure comprises a first plurality of metal wires, wherein both ends of each metal wire of the first plurality of metal wires are coupled to at least one metal layer to form a loop of a first height.

6. A semiconductor device in accordance with claim 4, wherein the second wire fence structure comprises a second plurality of metal wires, wherein both ends of each metal wire of the second plurality of metal wires are coupled to at least one metal layer to form a loop of a second height.

7. A semiconductor device in accordance with claim 4, wherein the first wire fence structure and the second wire fence structure run approximately parallel to an edge of the semiconductor device.

8. A semiconductor device in accordance with claim 4, wherein the first wire fence structure and the second wire fence structure are positioned around a perimeter of the semiconductor device.

9. A semiconductor device in accordance with claim 4, further comprising a nonconductive coating applied to the mold compound.

10. A semiconductor device comprising:
a substrate having a plurality of metal layers;
a die coupled to the substrate;
a first plurality of metal wires, wherein both ends of each metal wire of the first plurality of metal wires are coupled to at least one metal layer to form a loop of a first height;
a second plurality of metal wires, wherein both ends of each metal wire of the second plurality of metal wires are coupled to at least one metal layer to form a loop of a second height, wherein at least one of the second plurality of wires forms a loop over at least one of the first plurality of metal wires and is in the same vertical plane as the at least one of the first plurality of metal wires;

a mold compound encapsulating the die, a first surface of the substrate, the first plurality of metal wires, and the second plurality of metal wires, wherein a portion of the loop of at least one metal wire of at least one of the first plurality of metal wires or second plurality of metal wires is exposed; and a conductive coating applied to the mold compound and to the portion of the loop of the at least one metal wire exposed.

11. A semiconductor device in accordance with claim 1, further comprising:

a third plurality of metal wires, wherein both ends of each metal wire of the third plurality of metal wires are coupled to at least one metal layer to form a loop of a third height, wherein each of the third plurality of metal wires are placed next to and approximately aligned with a corresponding metal wire of the first plurality of metal wires; and a fourth plurality of metal wires, wherein both ends of each metal wire of the fourth plurality of metal wires are coupled to at least one metal layer to form a loop of a fourth height, wherein each of the fourth plurality of metal wires are placed over a corresponding metal wire of the third plurality of metal wires and approximately aligned with a corresponding metal wire of the first plurality of metal wires.

12. A semiconductor device in accordance with claim 10 wherein the loops formed by the first plurality of metal wires and the loops formed by the second plurality of metal wires run approximately parallel to an edge of the semiconductor device.

13. A semiconductor device in accordance with claim 10 wherein the loops formed by the first plurality of metal wires and the loops formed by the second plurality of metal wires are positioned around a perimeter of the semiconductor device.

14. A semiconductor device in accordance with claim 10, wherein each of the second plurality of metal wires are placed over a corresponding metal wire of the first plurality of metal wires, wherein a portion of the loop of at least one metal wire of the second plurality of metal wires is exposed and attached to the conductive coating.

15. A semiconductor device in accordance with claim 14, further comprising a third plurality of metal wires, wherein each of the third plurality of metal wires are placed under a corresponding metal wire of the first plurality of metal wires.

16. A semiconductor device in accordance with claim 10, further comprising a plurality of contacts coupled to a second surface of the substrate.

17. A semiconductor device in accordance with claim 10, further comprising a nonconductive coating applied to the mold compound.

* * * * *

UNITED STATES PATENT AND TRADEMARK OFFICE
CERTIFICATE OF CORRECTION

| | | |
|---|---|---|
| PATENT NO. | : 8,012,868 B1 | |
| APPLICATION NO. | : 12/335365 | |
| DATED | : September 6, 2011 | |
| INVENTOR(S) | : Herbert delos Santos Naval et al. | |

It is certified that error appears in the above-identified patent and that said Letters Patent is hereby corrected as shown below:

On the Title Page

Item (73) Name of Assignee should read: Amkor Technology, Inc.

Residence: Chandler, AZ

Signed and Sealed this
Fifth Day of June, 2012

David J. Kappos
*Director of the United States Patent and Trademark Office*